United States Patent [19]
Giesecke et al.

[11] Patent Number: 5,436,034
[45] Date of Patent: Jul. 25, 1995

[54] PROCESS FOR IMPROVING THE ADHESIVENESS OF ELECTROLESSLY DEPOSITED METAL FILMS

[75] Inventors: Henning Giesecke, Cologne; Gerhard-Dieter Wolf, Dormagen; Wilfried Haese, Odenthal, all of Germany

[73] Assignee: Bayer Aktiengesellschaft, Leverkusen, Germany

[21] Appl. No.: 358,660

[22] Filed: Dec. 19, 1994

Related U.S. Application Data

[63] Continuation of Ser. No. 31,458, Mar. 15, 1993, abandoned.

[30] Foreign Application Priority Data

Mar. 25, 1992 [DE] Germany ................. 42 09 708.8

[51] Int. Cl.$^6$ ............................................. B05D 3/02
[52] U.S. Cl. ............................... 427/508; 427/96; 427/123; 427/126.1; 427/264; 427/265; 427/270; 427/272.2; 427/282; 427/385.5; 427/407.1; 427/419.1; 427/443.1; 427/493; 427/510; 427/558; 427/559
[58] Field of Search ............. 427/493, 508, 510, 558, 427/559, 96, 123, 126.1, 264, 265, 270, 272, 282, 272.2, 385.5, 407.1, 419.1, 443.1

[56] References Cited

U.S. PATENT DOCUMENTS

| | | | |
|---|---|---|---|
| 3,305,460 | 2/1967 | Lacy | 427/380 |
| 3,560,257 | 2/1971 | Schneble et al. | 428/137 |
| 4,268,536 | 5/1981 | Beckenbaugh | 427/558 |
| 4,344,982 | 8/1982 | Chen | 427/508 |
| 4,368,281 | 1/1983 | Brummett et al. | 523/458 |
| 4,753,821 | 6/1988 | Giesecke | 427/306 |
| 4,764,401 | 8/1988 | Sirinyan | 427/443.1 |
| 4,830,714 | 5/1989 | Sirinyan | 427/443.1 |
| 4,832,989 | 5/1989 | Giesecke et al. | 427/306 |
| 4,910,045 | 3/1990 | Giesecke et al. | 427/98 |
| 5,032,488 | 7/1991 | Finter | 430/270 |
| 5,176,743 | 1/1993 | Reichert et al. | 106/1.11 |
| 5,182,135 | 1/1993 | Giesecke et al. | 427/98 |
| 5,200,272 | 4/1993 | Sirinyan | 427/306 |

FOREIGN PATENT DOCUMENTS

| | | |
|---|---|---|
| 1271374 | 7/1990 | Canada . |
| 0214097 | 3/1987 | European Pat. Off. . |
| 0256395 | 2/1988 | European Pat. Off. . |
| 0456908 | 11/1991 | European Pat. Off. . |
| 1958839 | 6/1971 | Germany . |
| 3625587 | 2/1988 | Germany . |
| 3627256 | 2/1988 | Germany . |
| 3743780 | 7/1989 | Germany . |
| 4025811 | 1/1992 | Germany ................. 427/508 |
| 2169925 | 7/1986 | United Kingdom . |

OTHER PUBLICATIONS

Patent Abstracts of Japan, vol. 14, No. 497, Oct. 30, 1990, 2-205686.

*Primary Examiner*—Bernard Pianalto
*Attorney, Agent, or Firm*—William C. Gerstenzang; Sprung Horn Kramer & Woods

[57] ABSTRACT

Electrolessly deposited metal films having improved adhesion can be obtained by coating the surface of the substrates to be metallized with a formulation consisting of UV-curable varnishes which contain noble metal compounds as activators and, in addition, either fillers or solvents or a combination of fillers and solvents, curing these varnishes by means of UV radiation, followed by electroless metallization of the substrates thus treated.

11 Claims, No Drawings

PROCESS FOR IMPROVING THE ADHESIVENESS OF ELECTROLESSLY DEPOSITED METAL FILMS

This application is a continuation of application Ser. No. 08/031,458, filed on Mar. 15, 1993, now abandoned.

BACKGROUND OF THE INVENTION

1. Field of the Invention

The invention relates to a process for producing metal films of improved adhesion on non-conducting substrates, in which a UV-curable varnish is used as binder for noble metal compounds (activators), which additionally contains either fillers or solvents or a combination of fillers and solvents.

2. Description of the Related Art

It is known that in order to achieve strongly adhering metal coatings on electrically non-conducting substrates first an adhesion-promoting varnish is applied to the surface of the substrate. However, the disadvantage of this method of pretreatment, in which, for example, ABS polymers are used, is that before the actual metallisation a moulded article coated with such a varnish film must be treated with a pickling solution in order to roughen the surface (DE-OS (German Published Specification) 1,958,839).

Therefore, it has already been proposed to treat non-metallic substrates without prior pickling directly with an activator solution for electroless metallisation, which solution contains, as adhesion promoter, mixtures of, for example, acrylonitrile/butadiene copolymers and, if desired, phenolic resins; the composition of such mixtures is fairly complicated (U.S. Pat. Nos. 3,305,460; 3,560,257). Nevertheless, the adhesiveness of the metal films produced is not sufficient, and the adhesion-promoting polymers do not fulfil the high demands made on the thermal and electrical properties, for example, of printed circuit boards. This is why such a process has so far not been generally accepted in industry.

It is true that the process according to U.S. Pat. No. 4,368,281 in contrast produces better adhesiveness, but this process requires excessively high amounts of activator, i.e. 5 to 16% by weight, relative to the total amount of adhesion promoter.

In combination with the use of small amounts of activator, good adhesiveness has previously only been achieved by treating substrate surfaces with formulations containing, as essential components, noble metal compounds (activators), binders, fillers and more than 40% by weight, relative to the total amount of adhesion promoter, of solvents. Such processes are described in DE-OS (German Published Specification) 3,627,256, DE-OS (German Published Specification) 3,625,587 and DE-OS (German Published Specification) 3,743,780. The good metal adhesion on these formulations is explained by the fact that upon drying of the adhesion promoter rough, porous surfaces are formed in which the electrolessly deposited metal films can be anchored.

SUMMARY OF THE INVENTION

It has now been found that metallisations having excellent adhesiveness can also be produced on the basis of UV-curable varnishes if these UV-curable varnishes are mixed with noble metal compounds (activators) and fillers or noble metal compounds and up to 25% by weight of solvents or noble metal compounds and a combination of fillers and up to 25% by weight of solvents as the essential components. The process according to the invention is all the more surprising as UV curing which is known to be rapid produces smooth varnish films which are closed on the surfaces.

A process has been found for the electroless deposition of strongly adhering metal films on UV-curable varnishes, which process consists essentially of the steps of a) coating the surfaces with UV-curable formulations, b) curing the coated surfaces with UV radiation and c) electroless metallisation of the UV-cured films and is characterised in that the formulations of the varnishes contain, apart from the customary components of UV-curable varnishes, 0.5 to 5% by weight of noble metal compounds from subgroup I or VIII of the periodic table (Mendeleev) as metallisation activators and, in addition, either 2 to 20% by weight of fillers or up to 25% by weight of solvents or a combination of 2 to 20% by weight of fillers and up to 25% by weight of solvents, all weights given being based on the entire formulation.

DETAILED DESCRIPTION OF THE INVENTION

Accordingly, the new formulations usable according to the invention contain, apart from the binders, reactive diluents and photoinitiators customary for UV varnishes, on the one hand the noble metal compounds mentioned and, on the other hand, either fillers or solvents or a combination of both as essential components.

UV-curable varnishes are known to one skilled in the art. Examples are: unsaturated polyesters, polyester acrylates, epoxy acrylates and urethane acrylates. Reactive diluents for UV varnishes are also known; examples are: styrene, vinyl acetate, N-vinylpyrrolidone, 2-ethylhexyl acrylate, 2-ethoxyethyl acrylate as monofunctional compounds and 1,6-hexanediol diacrylate, trimethylolpropane acrylates, tripropylene glycol diacrylate, trimethylolpropylformal monoacrylate, pentaerythritol tetraacrylate as crosslinking multifunctional compounds. Photoinitiators which can be used for this purpose are also known to one skilled in the art and examples of these are: diketals, benzoin ethers, acetophenones, benzophenones and thioxanthones. Systems containing UV-curable binders, reactive diluents and photoinitiators of the type mentioned are described, for example, in U.S. Pat. No. 3,968,305, EP 274,593, EP 274,596, EP 20,344, U.S. Pat. Nos. 3,297,745, 3,673,140.

A content of 0.5 to 5% by weight, preferably 0.8 to 4% by weight, particularly preferably 1 to 3% by weight, of noble metal compounds from subgroup I or VIII of the periodic table (Mendeleev) is essential to the formulation used according to the invention of the adhesion promoter varnish. The percentages by weight given are based on the entire amount of the adhesion promoter. The noble metal compounds are present in the formulations to be used according to the invention either in dissolved or in finely dispersed form having particle sizes of below 5 μm. Of all the noble metals in subgroup I and VIII of the periodic table, platinum, palladium, gold and silver are preferably used. The noble metals can be used in the form of an inorganic or organic compound, preferably in the form of an organic compound. Such organic compounds are in many cases complexes. They can be prepared using olefines (dienes), α,β-unsaturated carbonyl compounds, crownethers, nitriles and diketones, such as 2,4-pentadione. A few important examples of such organic noble metal compounds are: 1,2- and 1,3-butadienepalladium dichloride, bis(acetonitrile)palladium dichloride, bis(benzonitrile)palladium dichloride, 4-cyclohexene-1,2-dicarboxylic anhydride palladium dichloride, mesityl oxide palladium chloride, 3-hepten-2-one palladium chloride, 5-methyl-3-hexen-2-one palladium chloride and bis(2,4-pentadione) palladium. These examples show the particular preference of palladium compounds.

The use of noble metal compounds from subgroup I or VIII of the periodic table of the type mentioned without additional binder is disclosed in DE-OS (German Published Specification) 3,025,307 and DE-OS (German Published Specification) 3,148,280 and DE-OS (German Published Specification) 3,324,767.

Although it is possible according to the invention to use a mixture of two or more noble metal compounds, it is preferred, for reasons of ease of preparation, to use only one noble metal compound.

A further essential component of the binder (varnish) formulations to be used according to the invention is either a filler or solvent content of up to 25% by weight or a content of a combination of fillers or such an amount of solvent. If such contents according to the invention are absent from the formulations, the coatings obtained on the substrates coated therewith show only satisfactory adhesion, with results of GT 1 to GT 0, for example, in the cross-hatch adhesion test (DIN 53 151). If, however, metal films are deposited electrolessly on such varnishes, the adhesion of these metal films is insufficient for many technical applications, for example for printed circuit boards, if fillers or solvents or a combination of both are omitted.

Accordingly, one of the measures according to the invention consists in the combination of the noble metal compounds mentioned in an amount of 2 to 20% by weight, preferably 3 to 15% by weight, very particularly preferably 5 to 15% by weight, relative to the entire amount of the formulation.

The fillers are added to the formulations to be used according to the invention in finely divided form in a particle size of below 5 μm. It is of course also possible to use mixtures of different fillers. Suitable fillers are also the auxiliaries otherwise known from the printing and coating technology, such as pigments, disperse silicas, clay minerals, carbon blacks and rheological additives. Examples of these are: aerosils, $TiO_2$, talc, iron oxides, kieselguhr, barytes, kaolins, ground quartz, smectites, pigment-grade carbon blacks, graphites, zinc sulphides, chrome yellow, bronzes, organic pigments and chalk. Such pigments furthermore have to fulfil the requirement of not impairing the subsequent UV curing of the formulation to any significant degree.

Fillers have also already been used in the formulations of above-cited DE-OS (German Published Specification) 3,627,256, DE-OS (German Published Specification) 3,625,587 and DE-OS (German Published Specification) 3,743,780; however, while large amounts of fillers must be used in those formulations which are physically drying and contain large amounts of solvents, the UV-curing systems used according to the invention make it possible to use much smaller amounts of fillers, relative to the binder, and nevertheless achieve excellent adhesions.

A further variant in the UV-curable formulations usable according to the invention consists in adding, in addition to the noble metal compounds mentioned, solvents in an amount of up to 25% by weight, for example 1 to 25% by weight, preferably 5 to 20% by weight, very particularly preferably 10 to 20% by weight, of solvents, the amounts by weight being based on the entire weight of the formulation. An advantage of this variant is that the solvent-containing formulations can be subjected to UV curing without prior drying.

Solvents which are suitable for this variant are known in the printing and coating technology. Examples are: aromatic and aliphatic hydrocarbons, such as toluene, xylene, trimethylbenzenes, petroleum ether and others; alcoholic compounds, such as glycerol, ethylene glycols, propylene glycols; ketones, such as methyl butyl ketone, cyclohexanone, methyl isobutyl ketone; esters, such as butyl acetate, dioctyl phthalate, butyl glycolate; glycol ethers, such as ethylene glycol monomethyl ether, diethylene glycol methyl ether, diglyme, propylene glycol monomethyl ether; esters of glycol ethers, such as ethylglycol acetate, propylene glycol monomethyl ether acetate; halogenated hydrocarbons; diacetone alcohol. It is of course also possible to use mixtures of two or more of these solvents and their blends with other solvents.

It is advantageous, not for technical or functional reasons but for reasons of workplace safety, to use solvent mixtures having a flash point of more than 21° C.

Yet another embodiment of the UV-curable formulations to be used according to the invention is the addition of noble metal compounds and a combination of the fillers and solvents mentioned. The fillers and the solvents can also be used in such combinations in the amounts indicated above.

Further additives to the formulations usable according to the invention are those which do not impair their functional properties, for example flow-improving agents, such as silicones, surfactants and others or colorants, for example for labelling and distinction.

The formulations usable according to the invention are in general prepared by mixing the components. For this purpose, apart from simple stirring, in particular the wet comminution apparatuses customary in coating and printing technology, such as kneaders, attritors, roll mills, dispersing disc stirrers, rotor/stator mills, ball mills and stirred mills are particularly suitable. The components of the formulation can of course also be incorporated in separate steps.

For example, it is possible to dissolve or disperse the activator (noble metal compound) first in the binders, reactive diluents and, if appropriate, solvents and only then to incorporate the fillers. A suitable process variant also consists in first pasting up the fillers in the solvents and reactive diluents by applying high shearing forces.

Yet another process variant consists in incorporating noble metal compounds, fillers and, if appropriate, solvents directly in the finished formulation of UV-curable varnish systems. This procedure is the obvious choice especially in those cases where soluble organic noble metal compounds and fillers, such as aerosils, modified $TiO_2$, bentonites and others are used.

The application of the formulations described makes it possible to activate surfaces of non-conducting substrates for electroless metallisation, resulting in extremely adhesive metal films. Application takes place in general by means of the procedures known from coating, printing and printed circuit board technology. It is possible to coat the surfaces completely or else only in part. Partial coating is used, for example, in additive production of printed circuit boards or in the production of partial screening surfaces. Examples of such application procedures are: spraying, brushing, rolling, offset printing, screen printing, tampon printing, dip-coating, curtain coatings. Layers of greater thickness can be produced by repeating the coating process. It is of course also possible to use the formulations to be used according to the invention for producing dry films by known procedures and to coat the substrate surfaces therewith. The coating thickness should be 0.5 to 50 μm, preferably 1 to 30 μm.

After coating, the applied formulations can be dried. In general, such a drying step is only recommended if afterwards structures are to be produced on the surfaces by partial exposure to light. In the case of such a drying, it can take place, for example, at a temperature in the range from room temperature to 150° C. and at atmospheric pressure or under reduced pressure. The drying periods can of course vary widely. Very short periods (10-20 minutes) are often sufficient.

Chemical curing of the varnish add-ons is carried out by means of UV radiation of wavelength 360 to 180 nm for 1 second to several minutes. Curing and crosslinking can of course also be effected by means of other types of active radiation, such as by means of X-rays, instead of UV radiation or light containing UV radiation. In such a case, the addition of photoinitiators to the formulations could even be omitted.

The variant often used in printed circuit board technology in which, although the surfaces of substrates are completely coated, only part of the coated surfaces is exposed to light and the varnish add-ons which are present on the unexposed plates and have therefore not been cured are then again removed, can of course also be carried out using the formulations usable according to the invention.

Examples of suitable non-conducting substrates for a coating according to the invention are: glass, quartz, ceramic, enamel, paper, polyethylene, polypropylene, epoxy resins, polyesters, polycarbonates, polyamides, polyimides, polyhydantoins, ABS plastics, silicones, polyvinyl halides, polyphenylene sulphides, polytetrafluoroethylenes. These substrates can be used in the form of boards, sheets, papers and webs. Of particular importance are substrates such as are used in the manufacture of printed circuit boards, for example phenolic resin paper, glass fibre reinforced epoxy boards, polyester sheets, polyimide sheets and ceramics.

The surfaces coated with the formulations usable according to the invention subsequently have to be activated for the subsequent electroless metal deposition by means of reduction. For this purpose, the reducing agents customary in electrodeposition, such as formaldehyde, hypophosphite, boranes, hydrazine hydrate can preferably be used. In principle, other reducing agents known to one skilled in the art are of course also possible.

A particularly preferred embodiment of this reduction consists in carrying it out in the metallisation bath using the reducing agents present in such baths. This embodiment is particularly suitable for aminoborane-containing nickel baths or formalin-containing copper baths.

The baths which are suitable for electroless metallisation are in principle known to one skilled in the art. They are baths containing salts of the metals cobalt, iron, copper, silver, gold, palladium and others and mixtures thereof.

The process according to the invention is suitable in particular for the deposition of metal films for printed circuits, key pads, switch mats, sensors and electromagnetic screens.

EXAMPLES

EXAMPLE 1

A. 60 parts by weight of an aliphatic urethane acrylate (viscosity of about 59,000 mPa.s at 23° C.), 27 parts by weight of the triacrylate of propoxylated trimethylolpropane (viscosity of about 150 mPa.s at 23° C.) were mixed with 5 parts by weight of benzil dimethyl ketal by means of a dissolver.

B. 3 parts by weight of butadienepalladiumdichloride, 20 parts by weight of ®Shellsol A, 10 parts by weight of butyl glycolate, 7 parts by weight of SiO₂ ®Aerosil 380 and 3 parts by weight of talc were incorporated in succession in solution A by means of an ultraturrax mixer. This gave a paste (viscosity of about 20,000 mPa.s at 23° C.) suitable for screen printing.

The paste was impressed on a PET sheet by screen printing. The print was then cured for 20 seconds using UV radiation and then copper-plated at 60° C. in an electroless copper bath (1.5 g/l of copper, 10 g/l of formalin solution (30% strength), 4.5 g/l of sodium hydroxide solution). This gave a copper-plated PET sheet bearing a metal layer of about 3 μm. Adhesiveness according to DIN 53 151 (cross-hatch adhesion test) GT 0. Adhesiveness according to DIN 53 494 (peeling test) >25 N/25 mm. (The add-on could not be peeled off without destroying the PET sheet).

EXAMPLE 2

15 parts by weight of butylglycol, 10 parts by weight of ®Shellsol A and 2 parts by weight of bis(acetonitrile)palladium dichloride were incorporated in 100 parts by weight of a UV-curable solution according to Example 1A by means of a dispersing disc stirrer. This formulation (viscosity of about 7000 mPa.s at 23° C.) was used to produce a film of about 25 μm in thickness on a PET sheet by means of a roll coater, and the film was UV-cured and metallised according to Example 1. After a heat treatment at 150° C., a copper-plated PET sheet having an adhesiveness according to DIN 53 494 of 20 N/25 mm was obtained.

EXAMPLE 3 (Comparative Example)

2 parts by weight of butadienepalladium dichloride, 25 parts by weight of ®Shellsol A and 15 parts by weight of butylglycol were stirred into 100 parts by weight of a UV-curable mixture according to Example 1A by means of a dispersing disc stirrer. This solution was used to metallise a PET sheet according to Example 2. A copper-plated PET sheet having a metal adhesion according to DIN 53 151 of GT 0 and according to DIN 53 494 of about 1 N/25 mm was obtained.

EXAMPLE 4

60 parts by weight of an aliphatic urethane acrylate (viscosity of about 4000 mPa.s at 23° C.), 40 parts by weight of hexanediol diacrylate and 5 parts by weight of benzil dimethyl ketal were mixed by means of a dispersing disc stirrer. 5 parts by weight of bis(benzonitrile)palladium dichloride, 15 parts by weight of titanium dioxide and 5 parts by weight of ®Aerosil 200 were dispersed in this solution. The finished formulation was brush-coated onto a polycarbonate sheet, UV-cured and copper-plated according to Example 1. After a heat treatment at 125° C., a copper-plated PC sheet having an adhesiveness of 22 N/25 mm was obtained.

EXAMPLE 5

3 parts by weight of bis(acetonitrile)palladium dichloride in 20 parts by weight of N-methylcaprolactam, 20 parts by weight of methoxypropyl acetate and 30 parts by weight of barium sulphate (Blanc Fixe micro) were stirred into 112 parts by weight of a commercially available, alkali-developable, UV-curable solder stop lacquer (DPR 305, from Asahi Chemicals). The formulation was applied to the surface of a polyimide sheet (®Kapton) by screen printing and predried at 80° C. for 30 minutes. It was then exposed to the light from a UV lamp for 8 seconds through a negative mask of a printed circuit diagram. The unexposed areas were washed out with 1% strength sodium hydroxide solution. The sheet was then postcured at 150° C. for 30 minutes and copper-plated in a formalin-containing copper bath (Cu 2 g/l, NaOH 3 g/l, formaldehyde 2 g/l, temperature 70° C.) for 1 hour. This gave a copper-plated PI sheet having a metal adhesiveness according to DIN 53 151 of GT 0 (MIL P 55 11 00 PA 4.8 4.2).

What is claimed is:

1. A process for the electroless deposition of strongly adhering metal films on the surfaces of nonconducting substrates, which consists essentially of the steps of
    a) coating the surfaces with UV-curable formulations, comprising
        i) a binder selected from the group consisting of unsaturated polyesters, polyester acrylates, epoxy acrylates and urethane acrylates,
        ii) a reactive diluent selected from the group consisting of styrene, vinyl acetate, N-vinylpyrrolidone, 2-ethylhexyl acrylate, 2-ethoxyethyl acrylate, 1,6-hexanediol diacrylate, trimethylolpropane acrylates, tripropylene glycol diacrylate, trimethylolpropylformal monoacrylate and pentaerythritol tetraacrylate, and
        iii) a photoinitiator selected from the group consisting of diketals, benzoin ethers, acetophenones, benzophenones and thioxanthones,
    b) curing the coated surfaces with UV radiation and
    c) electroless metallisation of the UV-cured films, wherein the formulations contain, apart from the customary components of UV-curable varnishes, 0.5 to 5% by weight of noble metal compounds from subgroup I or VIII of the periodic table (Mendeleev) as metallisation activators and, in addition, 2 to 20% by weight of fillers and 1–25% by weight of solvents, the weights given being based on the entire amount of the formulation.

2. The process of claim 1, wherein the noble metal compounds used acre organic noble metal compounds.

3. The process of claim 1, wherein the noble metal compounds used are organic palladium compounds.

4. The process of claim 1, wherein the amounts of noble metal compounds are 0.8 to 4% by weight.

5. The process of claim 4, wherein the amounts of noble metal compounds are 1 to 3% by weight.

6. The process of claim 1, wherein the amounts of fillers are 3 to 15% by weight.

7. The process of claim 6, wherein the amounts of fillers are 5 to 15% by weight.

8. The process of claim 1, wherein the amounts of solvents are 5 to 20% by weight.

9. The process of claim 8, wherein the amounts of solvents are 10 to 20% by weight.

10. The process of claim 1, wherein metal films for printed circuits, key pads, switch mats, sensors and electromagnetic screens are deposited.

11. A process for the electroless deposition of strongly adhering metal films on the surfaces of nonconducting substrates, which consists essentially of the steps of
    a) coating the surfaces with UV-curable formulations, comprising
        i) a binder selected from the group consisting of unsaturated polyesters, polyester acrylates, epoxy acrylates and urethane acrylates,
        ii) a reactive diluent selected from the group consisting of styrene, vinyl acetate, N-vinylpyrrolidone, 2-ethylhexyl acrylate, 2-ethoxyethyl acrylate, 1,6-hexanediol diacrylate, trimethylolpropane acrylates, tripropylene glycol diacrylate, trimethylolpropylformal monoacrylate and pentaerythritol tetraacrylate, and
        iii) a photoinitiator selected from the group consisting of diketals, benzoin ethers, acetophenones, benzophenones and thioxanthones,
    b) exposing the coated surface to light through a mask which allows exposure of only part of the coating.
    c) removing the nonexposed portion of the coating from the coated surface,
    d) electroless metallisation of the cured coating which remains on the surface of the substrate,
wherein the formulations contain, apart from the customary components of UV-curable varnishes, 0.5 to 5% by weight of noble metal compounds from subgroup I or VIII of the periodic table (Mendeleev) as metallisation activators and, in addition, 2 to 20% by weight of fillers and 1–25% by weight of solvents, the weights given being based on the entire amount of the formulation.

* * * * *